United States Patent [19]
Tuska et al.

[11] 4,206,648
[45] Jun. 10, 1980

[54] IMPEDANCE MEASURING CIRCUIT

[75] Inventors: James W. Tuska, Pennington; Anthony D. Robbi, Hopewell, both of N.J.

[73] Assignee: RCA Corporation, New York, N.Y.

[21] Appl. No.: 15,055

[22] Filed: Feb. 26, 1979

[51] Int. Cl.$^2$ .............................................. G01K 7/24
[52] U.S. Cl. ................................... 73/362 AR; 331/66
[58] Field of Search ..................... 73/362 AR, 362 R; 331/65, 66

[56] References Cited

U.S. PATENT DOCUMENTS

| | | | |
|---|---|---|---|
| 3,906,391 | 9/1975 | Murdock | 73/362 AR |
| 3,911,374 | 10/1975 | Busse et al. | 73/362 AR |

*Primary Examiner*—Donald O. Woodiel
*Attorney, Agent, or Firm*—Paul J. Rasmussen; Allen LeRoy Limberg; Allan J. Jacobson

[57] ABSTRACT

An improved circuit for measuring resistance, as for the resistance of a temperature sensor, wherein the resistance varies over a wide dynamic range. The circuit provides two switch means to charge two capacitors through the unknown resistance. A time interval means measures charging time for one or both capacitors. Since charging time is directly proportional to resistance, a value of resistance is computed for one or both charging times. Control means, responsive to the time interval means, is provided to sequentially operate one or both switch means, the control means including means for selecting that charging time which is as long as possible yet within the range of the time interval means, thereby obtaining a higher resolution measurement in the range of sensor resistance where resolution would otherwise be inadequate.

10 Claims, 7 Drawing Figures

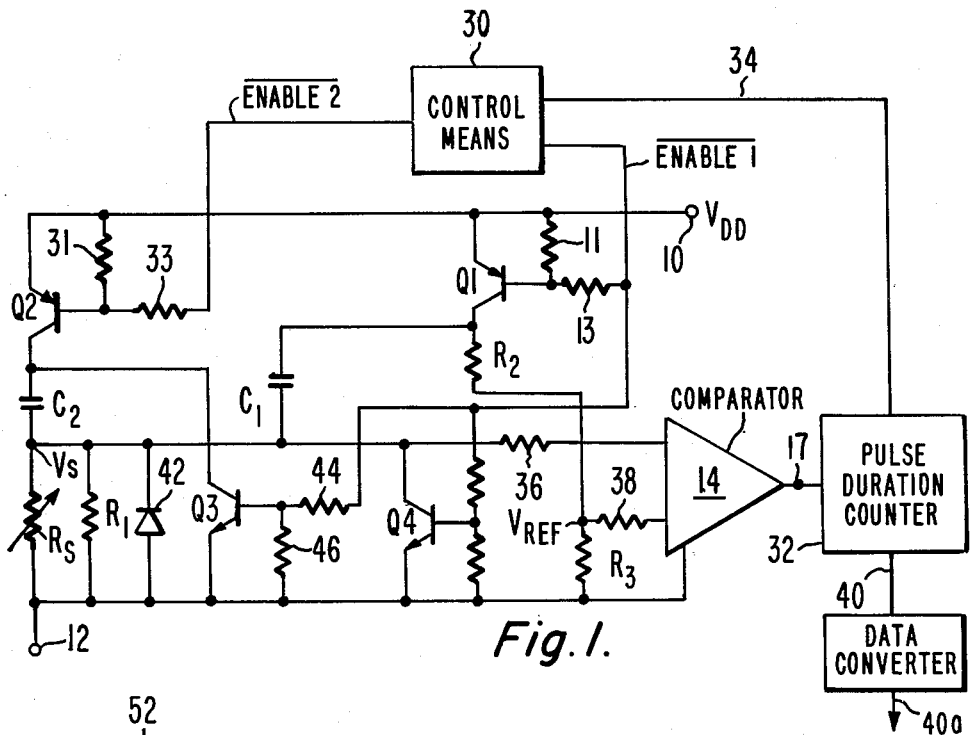
Fig.1.
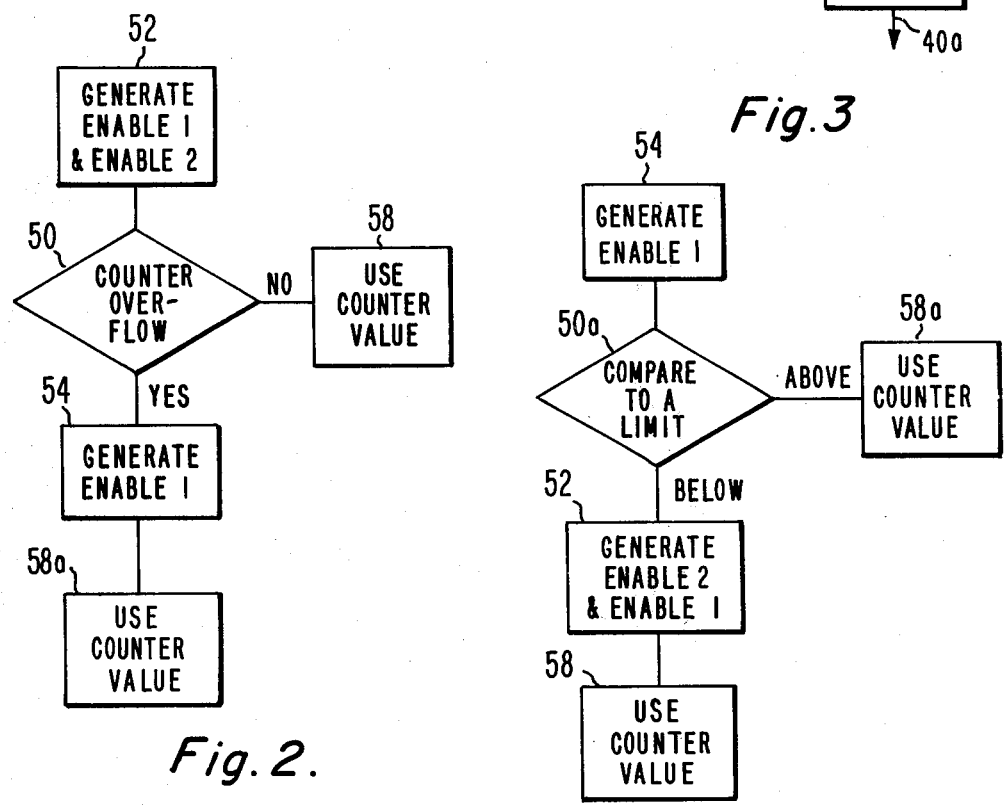
Fig.2.
Fig.3

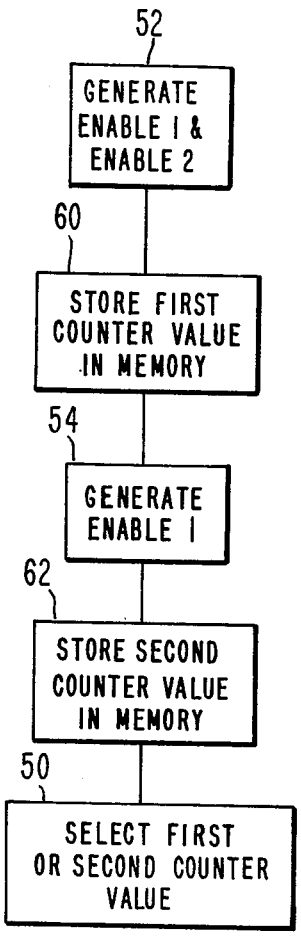
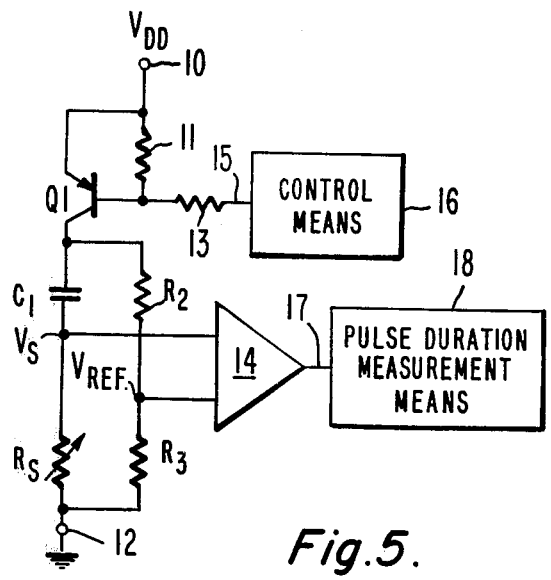
Fig.5.
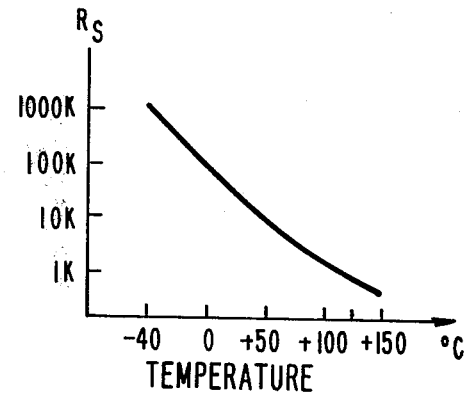
Fig.4.
Fig.6.
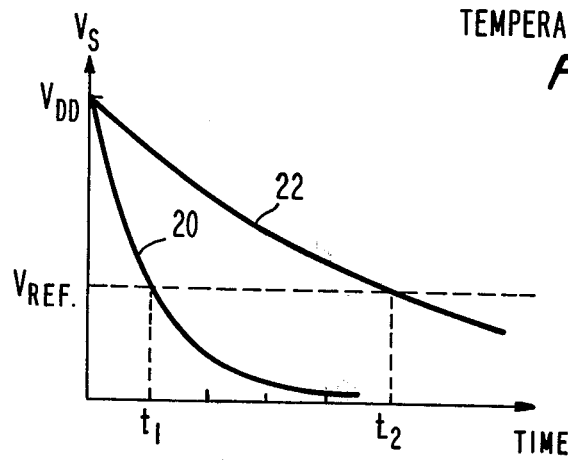
Fig.7.

IMPEDANCE MEASURING CIRCUIT

This invention relates to a means for measuring the impedance of a sensor wherein said sensor impedance varies over a wide dynamic range. More particularly, the invention relates to means for economically improving the resolution of impedance measurement wherein said impedance to be measured varies over several orders of magnitude.

A basic method for measuring impedance is to connect the unknown impedance in a charging circuit and then measure the time constant of the resulting circuit. For example, to measure resistance, the unknown resistance R is connected in series with a known capacitance C. A step voltage is then switched across the series combination and the time required to charge the capacitor is measured. Since charging time is proportional to the time constant RC of the circuit, the unknown value R can be determined. Similarly, an unknown C can be measured using a known R. In either case, it is assumed that sensor impedance does not vary significantly during measurement.

The same technique can be used to measure an unknown inductance L by establishing a current in the inductance through a known resistance R. The time required to bring the current through L to a predetermined level is measured. Since the measured time interval is proportional to the time constant of the circuit, L/R, the unknown value of L can be determined.

The above measurement technique is used in automotive applications to measure coolant temperature as part of an idle speed control system. Coolant temperature is sensed by a thermistor, a low cost sensor which changes resistance with temperature. Typically, thermistor resistance varies from 1 megohm at $-40°$ C. to 1 kilohm at $+125°$ C. Between these extremes, sensor temperature is a logarithmic function of resistance. Temperature is measured, therefore, by measuring the resistance of the thermistor and correlating the resistance to temperature. Non-linear variation of sensor resistance over a wide dynamic range (greater than one order of magnitude) creates a measurement problem. When measurement resolution is adequate at one end of the range, resolution at the other end will be inadequate.

For example, assume that thermistor resistance is measured by digital means. Specifically, assume a 7 bit digital counter is provided as a means for measuring a time interval. The counter begins counting when the charging circuit is first connected, and stops counting when a predetermined charge level is attained. After charging, the contents of the counter is proportional to time constant, which is proportional to resistance.

The resolution of a 7 bit counter is 1 part in 128, or about 0.8% of full scale per bit. Naturally, the resistance resolution is constant over the entire range. But, due to the non-linear response of the thermistor, the temperature resolution is not constant over the entire range. At $-40°$ C., with a 26.7 K linearizing resistor in parallel with the sensor, the resolution is $2°$ C. per bit. At $+125°$ C., the resolution is $10°$ C. per bit, which is unacceptable. The present invention is directed towards obtaining adequate resolution while still using a 7 bit counter, and not increasing the time required to make a measurement.

The problem is that for low resistances, the charging circuit charges up quickly leaving a low count in the counter. The present inventors realized that this means that the full resolving power of the counter, 1 part in 128 for a 7 bit counter, is under-utilized when the time constant is not of a value to bring the counter close to full count. Prior art attempts to improve resolution included increasing the number of bits in the counter and raising the clock rate, or using a technique known as variable prescaling. In the latter approach, a second, slower clock is used for the high resistance range, while maximum clock is used for the low resistance range. Since less than the maximum clock rate is used, measurement time is increased.

The present invention utilizes the full resolution capability of the counter (or any other time interval means), by changing the time constant of the measurement circuit so as to fill the counter more towards full capacity. Specifically, for low resistance, a larger capacitor is used. Therefore, the charging time is increased back up to an order of magnitude comparable to the charging time for high resistances. For both high and low resistances the measurement time tends to be substantially the same order of magnitude, and the counter tends to fill toward its full capacity, thereby utilizing the full resolution capability of the counter.

The full 1 part in 128 resolution capability of a 7 bit counter, continuing the previous example, is thus made available for expanded scale operation over a restricted portion, the low-resistance portion, of the range of sensor impedance. If the second charging circuit has a capacitor ten times as large as the first capacitor, measurement resolution is improved by approximately a factor of ten. In the above example, the resolution on the expanded scale at $+125°$ C. is $0.8°$ C. per bit.

The present invention is embodied in a circuit for measuring sensor impedance of particular utility for obtaining greater resolution where sensor impedance varies over a wide dynamic range. As previously described, sensor impedance is measured by connecting the sensor in a charging circuit and measuring the circuit time constant. The invention provides at least one additional charging circuit and suitable control means for measuring the time constant with the additional circuit. The control means, which is responsive to said time constant measurement, selectively operates the charging circuits for obtaining a higher resolution measurement in the range of sensor impedance where resolution would otherwise be inadequate.

In the drawings:

FIG. 1 is a schematic diagram, partially in block form, of a preferred embodiment of the invention;

FIGS. 2, 3 and 4 are flow charts indicating alternative logic sequences performed by the control means in the preferred embodiment of FIG. 1;

FIG. 5 is a simplified circuit diagram, partially in block form, illustrating the basic measurement technique utilized herein;

FIG. 6 is a graphical representation, plotted on a logarithmic scale, of resistance versus temperature for a typical thermistor; and FIG. 7 is a pair of voltage waveforms superimposed on the same axes representing the responses of the circuit of FIG. 5 for two resistance values of the thermistor.

The temperature sensor used in the present invention is a thermistor $R_s$, as indicated in FIGS. 1 and 5. FIG. 7 shows the temperature response for a typical thermistor. As can be seen by the graph in FIG. 6, the resistance of the sensor varies substantially logarithmically with temperature, increasing from 1 kilohm at 125° C. to 1 megohm at −40° C.

A simplified circuit diagram, FIG. 5, illustrates the basic measurement technique. The thermistor, $R_s$, is connected in series with capacitor C1 and switch means Q1. Resistors R2 and R3 comprise a voltage divider for providing a reference voltage $V_{REF}$. Terminal 10 is connected to a source of operating potential $V_{DD}$. Terminal 12 is connected to a source of reference potential, which is a fixed fraction of the operating potential.

The comparator 14 is a device which compares the signals on its input connections and indicates which of the two signals is larger. Voltage at its output 17 is "high" if $V_s$ exceeds $V_{REF}$ and is "low" if $V_{REF}$ exceeds $V_s$. It has been assumed for purposes of description that all logic elements operate in accordance with positive logic notation. Circuitry operating in accordance with negative logic notation could be used instead, as will be readily appreciated by one skilled in the art.

A pulse duration measurement means 18 connects to the output 17 of comparator 14 for measuring the time interval between the leading edge and falling edge of a pulse appearing at output 17 during a time constant measurement. The pulse measurement means 18 is self-actuating, beginning a new measurement responsive to the rising edge of the comparator output pulse. (Alternatively, the pulse measurement could be configured to begin a new measurement responsive to a reset signal from the control means 16.)

The circuit operates as follows: initially Q1 is non-conducting, and C1 is discharged through R2, R3, and $R_s$. Comparator output 17 is low. To measure resistance, the control means 16 turns on transistor Q1 through resistors 11 and 13, placing Q1 into saturated conduction. This applies the operating voltage $V_{DD}$ minus the collector emitter saturation voltage of Q1 to the series combination of $R_s$ and C1. The small collector-emitter voltage of Q1 during saturation is considered negligible. Note that the voltage divider R2, R3 for producing $V_{REF}$ is connected to the collector of Q1 rather than to a separate voltage source. This arrangement eliminates error due to Q1 saturation voltage since the $V_{REF}$ will track any change in the voltage applied to C1 and $R_s$. This further means that the resistance measurement is essentially independent of the absolute value of $V_{DD}$.

When Q1 turns on, $V_s$ becomes greater than $V_{REF}$, switching comparator output 17 to a high state. The subsequent voltage response at circuit node $V_s$ is shown in FIG. 7. Initially, the voltage at $V_s$ jumps to $V_{DD}$ and thereafter decays exponentially with a time constant equal to C1 times $R_s$. Waveform 20 indicates the rapid exponential decay of $V_s$ when the sensor resistance is low. Waveform 22 of FIG. 7 indicates the somewhat slower exponential decay of $V_s$ for a larger sensor resistance.

When $V_s$ decays to a value less than $V_{REF}$, the comparator output switches to a low again. Therefore, in response to Q1 being switched on by control means 16, the output 17 of comparator 14 goes high for a time interval, T, proportional to the time constant of the measurement circuit. If $R_s$ is a smaller resistance as indicated by curve 20 in FIG. 7, the duration of the output pulse from comparator 14 will be T1. On the other hand, if $R_s$ is a higher value of resistance, the duration of the output pulse of comparator 14 will be T2.

The voltage level $V_{REF}$ is set by selection of resistors R2 and R3. A convenient ratio is R3/(R2+R3)=0.37 or 37%. Since an exponential waveform decays to about 37% of its initial value in one time constant, $V_s$ will equal $V_{REF}$ after a time interval equal to C1 times $R_s$. As can be seen from the foregoing, pulse duration is proportional to sensor resistance $R_s$.

Note that R2 and R3 provide not only a resistor voltage divider network for producing $V_{REF}$, but also a conduction path for discharging C1 after measurement. When fully discharged the circuit is ready for a second measurement.

The circuit as thus far described is essentially measuring resistance, which must be correlated to temperature. One approach is a look-up table listing the corresponding temperature for each value of resistance. A microprocessor with a read-only memory (ROM) can be used to implement a look-up table. It is also possible, using analog or digital means, to take the inverse logarithmic function of the resistance measured and produce an adjusted signal representing temperature.

The circuit of FIG. 1 improves resolution by using an additional charging circuit comprising switch means Q2 (and its associated resistors 31 and 33) in series with capacitor C2. The additional charging circuit adds, in effect, an expanded scale to a portion of the range over which the measurement circuit operates.

As described above, a measurement of $R_s$ is initiated by switching on Q1. Here, control means 30 turns on Q1 by generating ENABLE 1. (When ENABLE 1 goes high, $\overline{\text{ENABLE 1}}$ goes low which turns on Q1). The expanded scale is created when C2 is added to the charging circuit via Q2. If Q1 and Q2 are turned on simultaneously (by $\overline{\text{ENABLE 1}}$ and $\overline{\text{ENABLE 2}}$ going low), the total capacitance (C1+C2) is increased, thereby increasing the time constant of the measurement circuit. (However, if C2 is larger than C1, only Q2 need be turned on to provide an expanded scale measurement, so long as $V_{REF}$ is independently provided).

The increased time constant results in a slower exponential decay of $V_s$, which in turn results in a longer output pulse from the comparator 14. The additional charging circuit makes use of the full resolution capability of the time interval measurement means to improve the measurement resolution at low values of $R_s$.

Control means 30 is responsive to the time interval measurement, as indicated by data path 34. In this particular embodiment, data path 34 includes the counter overflow indicator of the pulse duration counter 32.

In the embodiment shown, the pulse duration counter 32 is simply a gated counter, and a source of reference clock pulses, both well known in the art. The counter 32 is set to zero when the comparator output 17 goes high, and thereafter gated clocks are supplied to the counter. At the falling edge of the comparator output pulse 17, the counter 32 contains a count proportional to the pulse duration. If the pulse duration is long enough to produce an overflow condition in the counter 32, then the counter overflow indicator will go high. If, on the other hand, the counter is not in an overflow condition after the end of the output pulse from comparator 14, then the time interval counter contains a valid count, proportional to the resistance of temperature sensor.

FIG. 2 shows the program logic of the control means 30 of FIG. 1. Initially, ENABLE 1 and ENABLE 2 are high. Any voltage on C1 will be discharged through the voltage divider network R2 and R3 as described above.

Transistors Q3 and Q4 are on, discharging capacitor C2 and the measurement node $V_s$, respectively.

To measure resistance, the control means generates 52 ENABLE 1 and ENABLE 2. Switch means Q1 and switch means Q2 turn on, impressing the operating voltage $V_{DD}$ on both C1 and C2. The comparator output goes high because $V_s$ jumps to $V_{DD}$, which is greater than $V_{REF}$. As previously described, the comparator output will again go low when $V_s$ decays to a value equal to or less than $V_{REF}$. Note that by turning on Q1 and Q2, C1 and C2 provide a cumulative capacitance increasing the capacity of the charging means.

As indicated in the control program flow chart of FIG. 2, the control means reaches a decision branch 50. If there is no counter overflow, the counter value is used 58 as a measurement proportional to sensor resistance. On the other hand, if there was an overflow indication, then the control logic will set both $\overline{\text{ENABLE 1}}$ and $\overline{\text{ENABLE 2}}$ to a high condition. Thereafter $\overline{\text{ENABLE 1}}$ will be set low 54. Only switch means Q1 is closed and the voltage $V_{DD}$ impressed upon C1. Capacitor C2 is out of the circuit. With one capacitor included in the charging circuit, the charging time will be faster. After measurement, the contents 40 (FIG. 1) of the time interval counter 32 is used as a measurement proportional to sensor resistance. A data converter 40a correlates thermistor resistance to temperature.

Two other sequences that could alternatively be performed by control means 30 are shown in the flow charts FIGS. 3 and 4. It should be noted that in each of the programs described by the flow charts, sufficient program delay between events is necessary to allow for measurement time or capacitor discharge time, as required.

In FIG. 3, the high resistance range (C1) is enabled first 54. If the resulting measurement is above a predetermined resistance limit, the measurement is accepted 58a. Otherwise, the low resistance range is enabled 52. The decision branch 50a is actually a branch based on precision. If the measurement is equal to the predetermined limit, this condition may be arbitrarily assigned to be above or below the precision limit. This approach is similar to the approach of FIG. 2 in that the first measurement is accepted if its precision is high enough; otherwise, the second measurement range is enabled. Actually, FIG. 2 is a special case of the more general case of FIG. 3. In FIG. 2, the predetermined limit to which the measured value is compared is coincidentally equal to the maximum count plus one, i.e. a counter overflow condition.

In FIG. 4, wherein the control means includes memory, both high and low range measurements are made consecutively 52, 54 and stored in memory 60, 62. Subsequently, the more precise of the two measurements is selected 50 by the control means in accordance with an algorithm as shown in FIG. 2 or FIG. 3.

Contrast the embodiment described with the digital measurement technique known as variable prescaling. In the latter approach, a maximum clock frequency is used as the time base for low resistance measurement. A second clock, slower by perhaps a factor of ten, is used for high resistance measurement. Therefore, measurement time for high resistances is increased by a factor of ten. In the present invention, measurement time is substantially the same order of magnitude whether measuring high or low values of resistance.

There are several additional components shown in FIG. 1. Charge on C2 is discharged through an active path Q3 whenever the $\overline{\text{ENABLE 1}}$ line is high. It is permissible to use a passive discharge path to discharge C2 as is provided for C1. However, since C2 is typically ten times as large as C1, a resistive discharge path would place undue current requirements on switch means Q2. Therefore, an active discharge path is preferred. Resistor R1 is provided to somewhat linearize the response of the temperature sensor $R_s$. Resistors 36 and 38 are input scaling resistors for comparator 14. Diode 42 protects comparator 14 from negative voltages on the input when Q3 is discharging C2.

It should be apparent that alternate structure in lieu of the comparator and counter may comprise the means for measuring the time interval between the occurrence of two predetermined voltage or current levels. Furthermore, the control means 30 could be implemented in any of a number of ways, including hard wired logic or a programmed microprocessor. The implementation of any of the control sequences set forth in FIGS. 2, 3, and 4 in these ways is a matter of simple design, well within the capability of one skilled on the art of digital electronic circuit design. Many variations and additions are possible. Measurements may be initiated periodically, i.e., a new measurement made at every fixed time interval. If two ranges were not adequate for the resolution required, a third charging means may be incorporated. Nor is the approach limited to resistance measurement. The resolution of capacitance measurement wherein the capacitance varies over a wide dynamic range can be improved using the technique described herein. In all cases the approach is the same: use one or more charging means, responsive to the time interval measurement, and operate the charging means sequentially, selecting the more (or most) precise of the successive measurements.

Although the best mode to practice the invention has been shown and described it is to be recognized that the embodiment shown is illustrative only and not restrictive, the scope of the invention being indicated by the attached claims.

What is claimed is:
1. An impedance measuring circuit comprising:
 a measurement terminal to which one end of said impedance is connected;
 first and second supply terminals for receiving an operating voltage therebetween, the other end of said impedance being connected to said first supply terminal;
 a plurality of charging means connected between said measurement and second supply terminals for supplying respective charging currents through said impedance, each charging means having a respective time constant in conjunction with said impedance, each of said charging means including means for selective operation thereof;
 time interval means coupled to said impedance, responsive to first and second predetermined voltage levels at said measurement terminal for measuring the time interval between the occurrence of said first and second voltage levels, said time interval means having a time interval output which is proportional to said respective time constant over a range; and
 control means responsive to said time interval output for selectively operating said plurality of charging means so as to select that available time constant which provides a measured time interval which is as long as possible yet within the range of said time interval means, thereby fully utilizing the resolution capability of said time interval means.

2. Apparatus according to claim 1 wherein said time interval means for measuring said time interval comprises:
comparator means connected to said measurement terminal, responsive to said first and second predetermined voltage levels at said measurement terminal, for generating first and second outputs corresponding to the occurrence of said first and second voltage levels at said measurement terminal; and
digital counter means, connected to said comparator means output, for measuring the time interval between the occurrence of said first and second outputs, said counter means having a clock input terminal suitable for receiving a source of reference clock pulses, and said counter providing a digital output proportional to said measured time interval.

3. Apparatus according to claim 1 wherein said plurality of charging means comprises first and second charging means, each of which comprises:
a respective capacitor, one end of which is connected to said measurement terminal,
respective switch means having first, second, and third electrodes, the third electrode controlling conduction between the first and second electrodes, said switch connected at its first electrode to the second end of said capacitor, its third electrode to said control means, and at its second electrode to second supply terminal.

4. Apparatus according to claim 3 further including means responsive to said control means for discharging the first and second capacitors of said respective first and second charging means.

5. Apparatus according to claim 4 wherein said means for discharging said first capacitor comprises:
a first resistor connected at one end thereof to the first electrode of said first switch means; and
a second resistor connected at one end in series with said first resistor and at the other end to said first supply terminal, wherein said first and second resistors form a voltage divider network for producing a voltage at the interconnection of said first and second resistors equal to said second voltage level whenever the first switch means of said first charging means is conditioned for conduction.

6. Apparatus according to claim 4 wherein said control means is operated in accordance with the following steps:
generating a voltage on the third electrode of the switch means of said first charging means for conditioning same for conduction between the first and second electrodes thereof to complete a series circuit for charging the capacitor of said first charging means through said unknown resistance;
measuring a first time interval between the occurrence of said first and second predetermined voltage levels on said measurement terminal;
comparing said first measured time interval to a predetermined time interval value so that the precision of said first measured time interval is determined to be above or below a predetermined precision;
using said first measured time interval as proportional to the value of said unknown resistance when said first measured time interval is above said predetermined precision, and performing the following steps for determining a second time interval when said first measured time interval is below said predetermined precision;
discharging the capacitor of said first charging means;
generating a voltage on the third electrode of the switch means of said second charging means for conditioning same for conduction between the first and second electrodes thereof to complete a series circuit for charging the capacitor of said second charging means through said unknown resistance; and
measuring a second time interval between the occurrence of said first and second predetermined voltage levels on said measurement terminal; and
using said second measured time interval as proportional to the value of said unknown resistance.

7. Apparatus according to claim 4 wherein said control means is operated in accordance with the following steps:
generating a voltage on the third electrodes of the switch means of said first and second charging means for conditioning same for conduction between the respective first and second electrodes thereof to complete respective series circuits for charging the capacitors of said first and second charging means through said unknown resistance;
measuring a first time interval between the occurrence of said first and second predetermined voltage levels on said measurement terminal;
comparing said first measured time interval to a predetermined time interval value so that the precision of said first measured time interval is determined to be above or below a predetermined precision;
using said first measured time interval as proportional to the value of said unknown resistance when said first measured time interval is above said predetermined precision, and performing the following steps for determining a second time interval when said first measured time interval is below said predetermined precision;
discharging said capacitors of said first and second charging means;
generating a voltage on the third electrode of the switch means of said first charging means for conditioning same for conduction between the first and second electrodes thereof to complete a series circuit for charging the capacitor of said first charging means through said unknown resistance; and
measuring a second time interval between the occurrence of said first and second predetermined voltage levels on said measurement terminal,
using said second measured time interval as proportional to the value of said unknown resistance.

8. An apparatus for measuring a physical variable, the apparatus comprising:
a non-linear sensor, wherein the impedance thereof varies over at least two orders of magnitude responsive to said measured variable;
a measurement terminal to which one end of said sensor is connected;
first and second supply terminals for receiving an operating voltage therebetween, the other end of said sensor being connected to said first supply terminal;
a plurality of charging means connected to said measurement and second supply terminals for supplying respective charging currents through said sensor, each charging means having a respective time constant in conjunction with said sensor, each of said charging means including means for selective operation thereof;

time interval means coupled to said sensor, responsive to first and second predetermined voltage levels at said measurement terminal for measuring the time interval between the occurrence of said first and second voltage levels, said time interval means having a time interval output which is proportional to said respective time constant over a range;

control means responsive to said time interval output for selectively operating one or more of said plurality of charging means so as to select that available time constant which provides a measured time interval which is as long as possible yet within the range of said time interval means; and data converter means for correlating said measured time interval to said measured physical variable, wherein the measurement resolution of said measured variable over at least a portion of the lower order of magnitude of impedance range of said sensor is thereby improved.

9. Apparatus according to claim 8, wherein said physical variable is temperature and said sensor is a thermistor which is essentially resistive and varies in resistance according to temperature, said thermistor having a known substantially logarithmic relationship between resistance and temperature; and said data converter means correlates said measured time interval to said thermistor temperature according to said known logarithmic relationship, said data converter having a data output proportional to temperature.

10. In combination:

first and second supply terminals for receiving an operating voltage therebetween;

a measurement terminal;

an impedance of a first type and a plurality of impedances of a second type, all having respective first ends and respective second ends, the first end of the impedance of the first type being connected at said measurement terminal, the second end of said impedance of said first type being connected to said first supply terminal, one of said first and second types of impedance being primarily resistive and the other primarily reactive in nature, each of said impedances of second type having a respective time constant in association with said impedance of first type;

a plurality of switch means having first, second and third electrodes, the third electrode controlling conduction between the first and second electrodes, each of said plurality of switch means arranged to selectively connect a respective impedance of the second type between said measurement terminal and said second supply terminal whenever said respective switch means conducts between its respective first and second electrodes;

time interval means coupled to said impedance of the first type responsive to first and second predetermined voltage levels at said measurement terminal for measuring the time interval between the occurrence of said first and second voltage levels, said time interval means having a time interval output which is proportional to said respective time constant over a range; and control means responsive to said time interval output, the control means being connected to the respective third electrodes of said plurality of switch means for selecting that available time constant or combination of time constants which provides a measured time interval which is as long as possible yet within the range of said time interval means, thereby fully utilizing the resolution capability of said time interval means.

* * * * *